United States Patent [19]

Hirooka et al.

[11] Patent Number: 4,798,166

[45] Date of Patent: Jan. 17, 1989

[54] APPARATUS FOR CONTINUOUSLY PREPARING A LIGHT RECEIVING ELEMENT FOR USE IN PHOTOELECTROMOTIVE FORCE MEMBER OR IMAGE-READING PHOTOSENSOR

[75] Inventors: Masaaki Hirooka, Toride; Shunichi Ishihara, Ebina; Junichi Hanna; Isamu Shimizu, both of Yokohama, all of Japan

[73] Assignee: Canon Kabushiki Kaisha, Tokyo, Japan

[21] Appl. No.: 943,756

[22] Filed: Dec. 19, 1986

[30] Foreign Application Priority Data

Dec. 20, 1985 [JP] Japan .................................. 60-287347
Dec. 21, 1985 [JP] Japan .................................. 60-288213

[51] Int. Cl.$^4$ .............................................. C23C 16/00
[52] U.S. Cl. ...................................... 118/719; 118/725; 118/729; 118/733
[58] Field of Search ................ 118/719, 733, 725, 729

[56] References Cited

U.S. PATENT DOCUMENTS

| 3,306,768 | 2/1967 | Peterson | 427/255.3 |
|---|---|---|---|
| 3,394,679 | 7/1968 | Bentley | 118/733 |
| 3,404,661 | 10/1968 | Mathias | 118/719 |
| 3,602,192 | 8/1971 | Grochowski | 118/733 |
| 3,785,853 | 1/1974 | Kirkman | 118/719 |
| 3,805,736 | 4/1974 | Foehring | 118/719 |
| 4,048,955 | 9/1977 | Anderson | 118/725 |
| 4,430,149 | 2/1984 | Berkman | 118/719 |

4,501,766  2/1985  Suzuki .............................. 118/733

*Primary Examiner*—Richard Bueker
*Attorney, Agent, or Firm*—Fitzpatrick, Cella, Harper & Scinto

[57] ABSTRACT

There is provided an apparatus for continuously preparing an improved light receiving element for photoelectromotive force member or image-reading photosensor comprising the plural number of continuously connected reaction chambers through opening and shutting gates for forming respective constituent layers for said light receiving element and a substrate conveying belt moving through the reaction chambers, each of the reaction chambers having a film forming space, a gas supplying means being extended into the film forming space through the upper wall of the reaction chamber, an exhausting means being disposed at the bottom portion of the reaction chamber and the substrate conveying and supporting means being positioned in the reaction chamber, the said gas supplying means having (a) a conduit for transporting (i) a gaseous substance capable of contributing to form a deposited film and (b) a conduit for transporting (ii) a gaseous oxidizing agent being so disposed that the gaseous substance (i) and the oxidizing agent (ii) may be introduced into the space positioned above the surface of the substrate and they may be contacted each other in the absence of a plasma to thereby to generate plural kinds of precursors containing excited precursors and let at least one kind of those precursors directed to form a deposited film on the substrate on the substrate conveying belt.

2 Claims, 3 Drawing Sheets

FIG. 2A
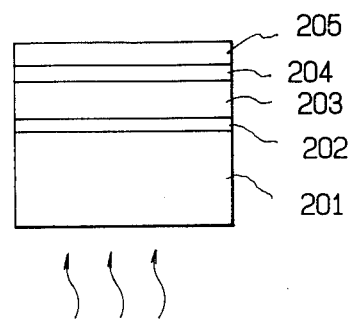
FIG. 2B
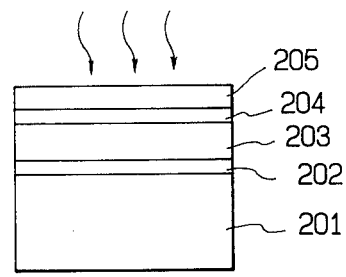
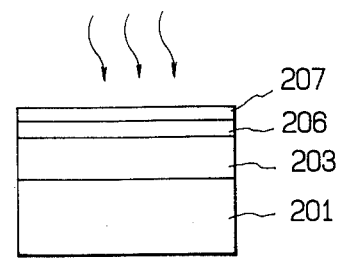
FIG. 2C

APPARATUS FOR CONTINUOUSLY PREPARING A LIGHT RECEIVING ELEMENT FOR USE IN PHOTOELECTROMOTIVE FORCE MEMBER OR IMAGE-READING PHOTOSENSOR

FIELD OF THE INVENTION

This invention relates to an apparatus for continuously preparing an improved light receiving element for use in a photoelectromotive force member or image-reading photosensor.

BACKGROUND OF THE INVENTION

There have been proposed a number of photoelectromotive force members having a photoelectric conversion layer of a non-crystalline material containing silicon atoms as the main component, namely the so-called amorphous silicon (hereinafter referred to as "a-Si").

Likewise, there have been proposed a number of image-reading photosensors having such photoelectric conversion layer composed of a-Si for use in a photovoltaic device or the like.

And there have been proposed various methods for the preparation of such photoelectric conversion layer the vacuum evaporation technique, heat chemical vapor deposition technique, plasma chemical vapor deposition technique, reactive sputtering technique, ion plating technique and light chemical vapor deposition technique.

Among those methods, the method using plasma vapor deposition technique (hereinafter referred to as "plasma CVD method") has been generally recognized as being the most preferred and is currently used to manufacture the photoelectric conversion layer.

However, for any of the known photoelectric conversion layers, even if it is an acceptable one that is obtained by plasma CVD method and that exhibits almost satisfactory characteristics, there still remain problems unsolved in satisfying totally the points for its characteristics, particularly electric and optical characteristics, photoconductive characteristics, deterioration resistance upon repeating use and use-environmental characteristics, other points for its homogeneity, reproducibility and mass-productivity and further points for its lasting stability and durability, which are required for the photoelectric conversion layer to be an immovable one.

The reasons are largely due to the circumstance that the photoelectric conversion layer can not be easily prepared by a simple layer deposition procedure but great skill and ingenuity are required in the process operations in order to obtain a desirable photoelectric conversion layer while having due regards to the starting materials.

For example, in the case of forming a film composed of an a-Si material according to heat chemical vapor deposition technique (hereinafter referred to as "CVD method"), after the gaseous material containing silicon atoms being diluted, appropriate impurities are introduced thereinto and the thermal decomposition of related materials is carried out at an elevated temperature between 500° and 650° C. Therefore, in order to obtain a desirable a-Si film by CVD method, precise process operation and control are required, and because of this the apparatus in which the process according to CVD method is practiced will eventually become complicated and costly. However, even in that case, it is extremely difficult to stably obtain a desirable homogeneous photoelectric conversion layer composed of an a-Si material having full measure of the desirable, in practically applicable characteristics on an industrial scale.

Now, although the plasma CVD method is widely used nowadays as above mentioned, it is still accompanied with problems relating to process operations and to facility investment.

Regarding the former problems, the operation conditions to be employed under the plasma CVD method are much more complicated than the known CVD method, and it is extremely difficult to generalize them.

That is, there already exist a number of variations even in correlated parameters concerning the temperature of a substrate, the amount and the flow rate of gases to be introduced, the degree of pressure and the high frequency power for forming a layer, the structure of an electrode, the structure of a reaction chamber, the flow rate of gases to be exhausted, and the plasma generation system. Besides said parameters, there also exist other kinds of parameters. Under these circumstances, in order to obtain a desirable deposited film product it is required to choose precise parameters from a great number of varied parameters. And sometimes serious problems occur. For instance, because of the precisely chosen parameters, a plasma is apt to be in an unstable state which invites problems in a deposited film to be formed.

And for the apparatus in which the process using the plasma CVD method is practiced, its structure will eventually complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters even for such apparatus still exist and the relevant parameters must be precisely chosen from the existing various parameters for the mass-production of such film. In accordance with such precisely chosen parameters, the process must then be carefully practiced.

Against this background, a photoelectromotive force member and an image-reading photosensor have become diversified nowadays. And there is an increased demand to stably provide a relatively inexpensive photoelectromotive force member and image-reading photosensor respectively having a photoelectric conversion layer with a normal square measure or a large square measure being composed of an a-Si material which has a suitable uniformity and many applicable characteristics and which is suited for the use in view and the application object.

Consequently there is an earnest desire to develop an appropriate method and apparatus to satisfactorily meet the above demand.

Likewise, there is a similar situation which exists with respect to other kinds of non-monocrystalline semiconducting layers to constitute the photoelectric conversion layer of a photoelectromotive force member and of an image-reading photosensor, for example, those composed of an a-Si material containing at least one kind selected from oxygen atoms, carbon atoms and nitrogen atoms.

SUMMARY OF THE INVENTION

The present inventors have conducted extensive studies in order to solve the problems in the aforementioned known methods and in order to develop a new process for effectively and simply preparing an improved photoelectromotive force member and an improved image-reading photosensor having a desirable photoelectric conversion layer composed of a non-crystalline semiconducting material, which has a wealth of practically applicable characteristics, without depending upon any known method and which meets the above-mentioned demands.

As a result, the present inventors finally have found an apparatus that enables one to efficiently and stably prepare said photoelectromotive force member and image-reading photosensor in simplified particular procedures as detailed below.

It is therefore an object of this invention to provide an improved photoelectromotive force member and an improved image-reading photosensor provided with a desirable photoelectric conversion layer composed of a non-crystalline semiconducting material which has many practically applicable characteristics and brings about excellent photoelectric conversion functions and which is prepared without depending upon plasma reaction.

Another object of this invention is to provide an apparatus for preparing the improved photoelectromotive force member and the improved image-reading photosensor by which the photoelectric conversion layer can be continuously mass-produced with simplified film forming conditions in a film forming space without plasma discharge while maintaining the characteristics of the film to be formed and promoting the film-forming rate.

These and other objects, as well as the features of this invention will become apparent by reading the following descriptions of preferred embodiments according to this invention while referring to the accompanying drawings.

BRIEF DESCRIPTION OF THE DRAWINGS

FIG. 2(A) through FIG. 2(C) are schematic cross-sectional views illustrating representative embodiments of the photoelectromotive force member according to this invention, in which FIG. 2(A) is a cross-sectional view of a first representative embodiment of the photoelectromotive force member for a photovoltaic device;

FIG. 2(B) is a cross-sectional view of a second representative embodiment of the photoelectromotive force member for a photovoltaic device; and FIG. 2(C) is a cross-sectional view of a third representative embodiment of the photoelectromotive force member for a photovoltaic device.

FIG. 3(A) through FIG. 3(E) are schematic portion views for illustrating representative embodiments of an image-reading photosensor according to this invention, in which FIG. 3(A) is a cross-sectional view of a first representative embodiment of an image-reading photosensor according to this invention;

FIG. 3(B) is a squint-eyed view for illustrating the whole body of the embodiment as shown in FIG. 3(A);

FIG. 3(C) is a cross-sectional portion view of a second representative embodiment of the image-reading photosensor according to this invention;

FIG. 3(D) is a cross-sectional portion view of a third representative embodiment of the image-reading photosensor according to this invention; and FIG. 3(E) is a cross-sectional portion view of a fourth representative embodiment of the image-reading photosensor according to this invention.

DESCRIPTION OF THE INVENTION

Figure 1:
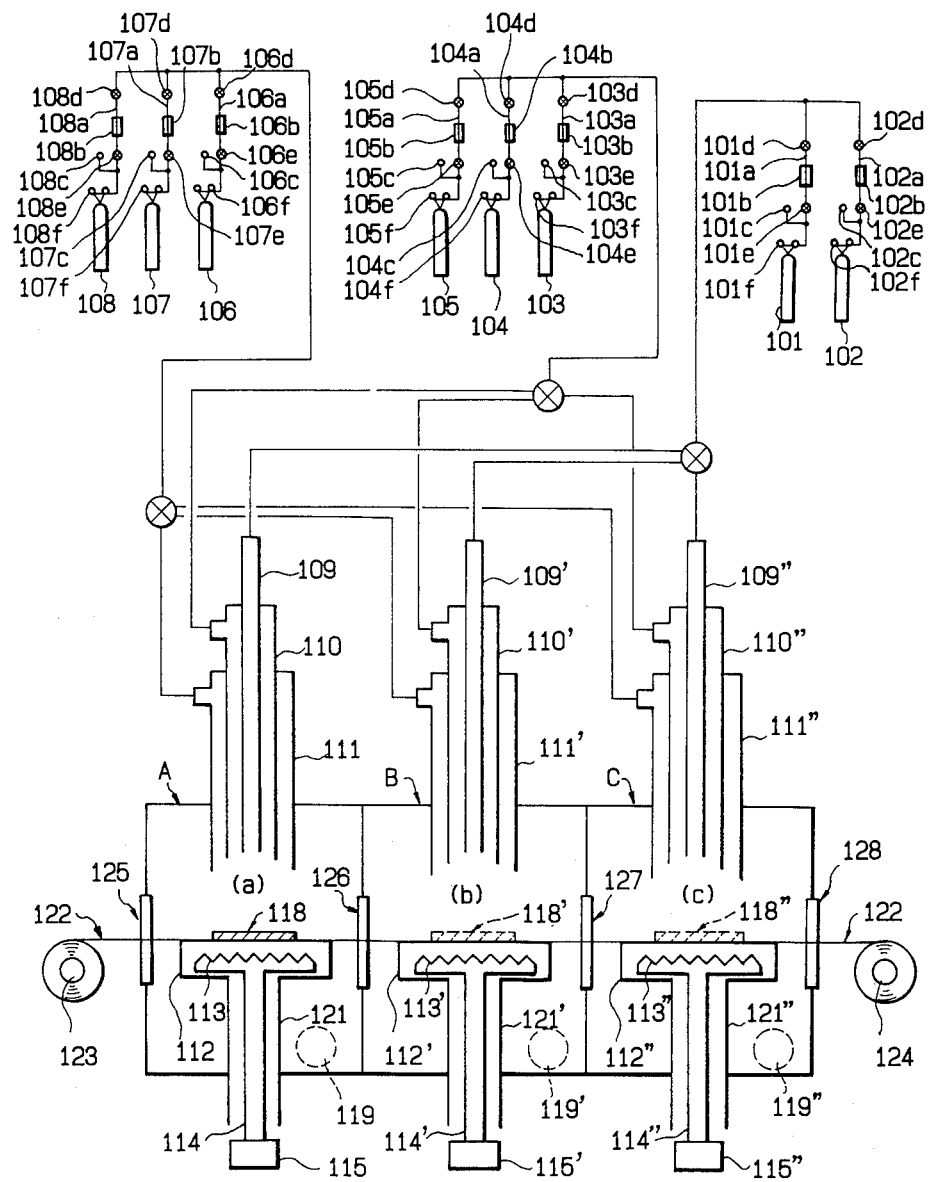
FIG. 1 is a schematic explanatory view of a representative embodiment of the apparatus for continuously preparing an improved light receiving element for use in a photoelectromotive force member or image-reading photosensor according to this invention.

The present inventors have made earnest studies for overcoming the foregoing problems on the conventional photoelectromotive force member and the conventional image-reading photosensor, and attaining the objects as described above and, as a result, have accomplished this invention based on the findings as described below.

That is, (i) a substance which can be a constituent for forming a photoelectric conversion layer but which does not or can hardly contribute to form said layer as long as it remains in its original energy state and (ii) another substance which can chemically react with the substance (i) to electronically oxidize it (which means that the atom, ion or molecule of the substance loses an electron, namely the oxidation number is increased; hereinafter referred to simply as "oxidizing agent") were selected, and the two substances in gaseous state were separately introduced through respective transporting passage into a film forming space wherein a suitable substrate is placed while being maintained at a temperature from 200° C. to 300° C. to thereby let the two substances collided and contact to occur a chemical reaction among the two substances in the space positioned above the substrate in the film forming space.

As a result, there was formed a homogeneous deposited film with a uniform thickness without accompaniment of any solid particle on the substrate.

And it was found that the resulting deposited film has a wealth of electric and optical properties and is uniformly accompanied with an excellent photoelectric conversion function.

When it was tried to prepare a photoelectromotive force member and an image-reading photosensor in accordance with the above procedures, there were obtained a desirable photoelectromotive force member and a desirable image-reading photosensor respectively having good practical applicable characteristics such as electric and optical characteristics, deterioration resistance upon repeating use and use-environmental characteristics and having an excellent photoelectric conversion function. As a result, it was confirmed that this method is of a sufficient repeatability.

This invention has been completed based on these findings, and it provides an apparatus for continuously preparing an improved light receiving element for use in photoelectromotive force member and in image-reading photosensor.

That is, the apparatus provided according to this invention comprises a plural number of reaction chambers continuously connected to one another through an opening and shutting gate and a substrate conveying and supporting means passing through all the reaction chambers, each of the reaction chambers having a film forming space, a gas supplying means extending into the film forming space through the upper wall of the reaction chamber, an exhausting means disposed at the bottom portion of the reaction chamber, and the substrate conveying and supporting means being positioned in the reaction chamber, the said gas supplying means having (a) a conduit for transporting (i) a gaseous substance capable of contributing to form a deposited film and (b) a conduit for transporting (ii) a gaseous oxidizing agent so disposed that the gaseous substance (i) and the oxidizing agent (ii) may be introduced into the space positioned above the surface of the substrate and may contact each other in the absence of a plasma thereby to generate plural kinds of precursors containing excited precursors and let at least one kind of those precursors directed to form a deposited film on the substrate on the substrate conveying and supporting means.

According to this invention, there can be continuously obtained a desirable photoelectric conversion layer in a simple process in the absence of a plasma without having any influence of plasma etching or any problem due to abnormal discharge actions since the process does not depend upon the conventional plasma CVD method using a gaseous plasma formed by subjecting the starting gaseous materials to the action of a discharge energy.

In addition, according to this invention, there are provided the following advantages: a desirable photoelectric conversion layer for a photoelectromotive force member or an image-reading photosensor having a uniform thickness and a desirable homogeneity may be effectively formed at an improved film forming rate using simple procedures without consumption of so much energy as in the conventional plasma CVD method; the operation parameters for preparing a photoelectric conversion layer for a photoelectromotive force member or an image-reading photosensor may be largely simplified; an improved photoelectromotive force member or an improved image-reading photosensor having such desirable photoelectric conversion layer or if necessary, of a large square measure may be mass-produced on an industrial scale to thereby reduce the cost of a product; and such a heavy investment as for the apparatus in the conventional plasma CVD method is not necessitated even in the case of setting up a particularly appropriate apparatus to practice the process of this invention.

DESCRIPTION OF THE PREFERRED EMBODIMENTS

A representative embodiment of the apparatus for continuously preparing an improved light receiving element for use in photoelectromotive force member and image-reading photosensor according to this invention is now described in a detail by reference to FIG. 1.

In this invention, there are used two kinds of substances; one is a substance which can be a constituent for forming a photoelectric conversion layer but which does not or can hardly contribute to form said layer as long as it remains in its original energy state (hereinafter referred to as "Substance A") and the oxidizing agent.

FIG. 1 is a schematic explanatory view of a representative embodiment of the apparatus for continuously preparing an improved light receiving element for use in photoelectromotive force member or image-reading photosensor according to this invention.

In FIG. 1, there are shown three reaction chambers A, B and C having reaction regions (a), (b) and (c) respectively. To the reaction chambers A through C, gas supplying series (i), (ii) and (iii) are connected through respective pipe ways.

In the gas supplying series (i), (ii) and (iii), there are shown gas reservoirs 101 through 108, gas supplying pipe ways 101a through 108a respectively extended from the gas reservoirs 101 through 108, mass flow controllers 101b through 108b being placed respectively on the gas supplying pipe ways 101a through 108a for controlling the flow rate of a gas from each of the gas reservoirs, pressure gages 101c through 108c, main valves 101d through 108d, sub-valves 101e through 108e and gas reservoir pressure gages 101f through 108f.

The gas supplying series (i) having the gas reservoirs 101 and 102 serves to supply a gaseous substance A such as $SiH_4$ gas and $CH_4$ gas. The gas supplying series (ii) having the gas reservoirs 103 through 105 serves to supply a gaseous substance for incorporating an n-type impurity such as $PH_3$ gas or a p-type impurity such as $B_2H_6$ gas into a layer to be formed. And the gas supplying series (iii) having the gas reservoirs 106 through 108 serves to supply a gaseous oxidizing agent such as $F_2$ gas and $O_2$ gas and an inert gas such as He gas.

The reaction chambers A through C are provided respectively with first gas supplying conduit 109, 109' and 109'', second gas supplying conduit 110, 110' and 110'', and third gas supplying conduit 111, 111' and 111'', which are extended into the film forming spaces of the respective reaction chambers and ended so as to leave relevant spaces sufficient to establish the reaction regions (a) through (c) between substrates 118, 118' and 118'' to be placed therein.

In every reaction chamber, as for the first, second and third gas supplying conduits, it is preferred to use a concentric triplicate conduit having a first circular space as the first gas supplying conduit, a second circular space as the second gas supplying conduit and a cylindrical space positioned in the middle as the third gas supplying conduit.

And the end portion of the concentric triplicate conduit in the film forming space is desired to be in such a form as shown with an as inwardly cut surface at an external appearance (i.e., the inner conduits "109, 109' and 109''" extends less far into the chamber A, B and C than does the middle conduit "110, 110' and 110''", which extends in less far than does the outer conduit "111, 111' and 111''"), leaving a round space to act as the reaction region. And with the inwardly cut surface the outlet of each of the gas supplying conduits is downwardly opened.

As an alternative, the end portion of the concentric triplicate conduit may be structured in such a way that the outlet of the third gas supplying conduit in the cylindrical form is positioned in the innermost recess and the remaining end portion composed of the outlets of the first and second gas supplying conduits is in the diagonally cut surface form so as to leave a space in the form of a conic trapezoid to act as the reaction region.

To the other end of each of the first gas supplying conduits 109, 109' and 109'', a gas feeding pipe for the gases from the gas reservoirs 101 and 102 in the gas supplying series (i) is connected through an appropriate valve means.

To the other end of each of the second gas supplying conduits 110, 110' and 110'', a gas feeding pipe for the gases from the gas reservoirs 103, 104 and 105 in the gas supplying series (ii) is connected through an appropriate valve means. And, to the other end of each of the third gas supplying conduits 111, 111' and 111", a gas feeding pipe for the gases from the gas reservoirs 106, 107 and 108 in the gas supplying series (iii) is connected through an appropriate valve means.

In the reaction chambers A, B and C, there are provided substrate holders 112, 112' and 112" having internally installed heaters 113, 113' and 113" which can be shifted upwardly or downwardly through their supporting arms 121, 121' and 121" with appropriate driving means (not shown).

The heaters 113, 113' and 113" are electrically connected to electric power sources 115, 115' and 115" through leading wires 114, 114' and 114".

With each of the reaction chambers A, B and C, there is provided an appropriate thermocouple (not shown) in order to measure the temperature of a substrate.

In every reaction chamber, the position of the substrate, namely represented by the numerals 118, 118' and 118" respectively in the reaction chambers A, B and C, is properly adjusted by shifting the substrate holder so that there is left a desired distance between the surface of the substrate and the outlets of the gas supplying conduits upon forming a deposited film thereon.

Such desired distance is determined properly depending upon the kind of a deposited film to be formed in that reaction chamber, its characteristics as expected, the flow rate of a gas to be employed, the internal pressure in the reaction chamber and the like.

However, in general, it is preferably several millimeters to 20 cm, and more preferably 5 mm to 15 cm.

The heater is operated usually to heat the substrate to an appropriate temperature or to conduct a provisional heat treatment on the substrate. However, the heater can be used to anneal the deposited film formed on the substrate.

With the bottom part of each of the reaction chambers A, B and C, there is provided an exhaust pipe, namely the exhaust pipe 119 for the reaction chamber A, the exhaust pipe 119' for the reaction chamber B, and the exhaust pipe 119" for the reaction chamber C, respectively having a suitable exhaust valve connected to an exhaust device (not shown).

In any case, the air or gas in the gas feeding pipe, the gas supplying conduits and the reaction chamber can be effectively evacuated by operating the exhaust device through the exhaust pipe.

The numeral 122 stands for substrate a conveying belt conveying the substrates 118, 118' and 118" into the reaction chambers A, B and C, and taking out those substrates from the system.

The substrate conveying belt 122 is initiated by feed roll 123 and terminated at wind roll 124. The substrate conveying belt 122 is moved by the rotating action of the wind roll 124 while being face-to-face contacted with the substrate holders 112, 112' and 112". And with respective partitions of the reaction chambers A, B and C, there are provided opening and shutting gates 125, 126, 127 and 128. Every opening and shutting gate is such that it can be driven longitudinally along the partition by a driving means (not shown) and can be operated in the following way. That is, in the case of moving the substrate conveying belt 122 itself, it can be situated at a predetermined position and can serve to seal the inside of the reaction chamber and at the same time to allow slide-like forward movement of the substrate conveying belt, and in the case of introducing the substrate placed on the substrate conveying belt into or taking out the substrate from the reaction chamber, it can be opened while leaving a space to permit smooth passing thereof and shut thereafter.

In the thus structured apparatus of this invention, prior to starting the film forming operation, a substrate 118 is placed on the conveying belt 122 in the front of reaction chamber A, then the substrate is introduced into the reaction chamber A by opening the gate 125 and at the same time starting up the wind roll 124. Once the substrate is moved onto a predetermined position of the substrate holder 112, the wind roll is stopped and at the same time the gate 125 is shut properly. Thereafter, the film forming operation of a first layer onto the substrate 118 is started.

After the first layer is formed on the substrate 118, the substrate 118 is introduced into the reaction chamber B by opening the gate 126 and at the same time starting up the wind roll 124. Once the substrate 118 is moved onto a predetermined position of the substrate holder 112', the wind roll is stopped and at the same time the gate 126 is shut properly, the substrate having the first layer formed thereon being represented by the numeral 118'. Thereafter, the film forming operation of a second layer onto the first layer is started. After the second layer is formed on the substrate 118', the substrate 118' is introduced into the reaction chamber C by opening the gate 127 and at the same time starting up the wind roll 124.

Once the substrate 118' is moved onto a predetermined position of the substrate holder 112", the wind roll is stopped and at the same time the gate 127 shut properly, the substrate having the first and second layers formed thereon being represented by the numeral 118". Thereafter, the film forming operation of a third layer onto the second layer is started. After the third layer is formed on the substrate 118", the substrate 118" is taken out from the reaction chamber C by opening the gate 128 and at the same time starting up the wind roll 124.

Each of the above film forming operations is, if appropriate carried out under a predetermined reduced pressure condition.

And, since it is necessary to hinder related inner atmosphere of every reaction chamber at the time of introducing the substrate into the first reaction chamber, transferring it from one reaction chamber to another reaction chamber, and taking out it from the final reaction chamber, the related atmospheric conditions are usually maintained at a uniform pressure condition.

And in the case where two or more reaction chambers are concerned, the related internal atmospheric conditions among those reaction chambers are maintained at a uniform pressure condition with the use of an inert gas.

In the above explanation, reference has been made to the case of forming a deposited layer on a substrate. However, it is of course possible to continuously prepare the plural number of layered products at the same time in the apparatus of this invention.

In that case, after the film forming operation of a first layer on a first substrate 118 is completed, a second substrate 118 is introduced into the reaction chamber A at the same time when the first substrate 118' now having the first layer formed thereon is transferred into the reaction chamber B.

Thereafter, the film forming operation of a second layer on the first substrate 118' and that of a first layer on the first substrate 118 are carried out at the same time. After the respective film forming operations are completed, a third substrate 118 is introduced into the reaction chamber A at the same time when the first substrate 118" and the second substrate 118' are transferred into the reaction chamber C and the reaction chamber B respectively.

Thereafter, the film forming operation of a first layer on the third substrate 118, that of a second layer on the second substrate 118' and that of a third layer on the first substrate 118" are carried out at the same time. After the respective film forming operations are completed, the first substrate 118" is taken out from the reaction chamber C, and the same procedures as above mentioned are repeated to thereby obtain a layered product continuously.

In the above representative embodiment of the apparatus of this invention, the apparatus comprises three reaction chambers. But it is possible for the apparatus of this invention to have two or more than three reaction chambers according to the number of layers to be formed on a substrate to obtain a desired light receiving element for use in electromotive force member or image-reading photosensor.

Because of the generation of plural kinds of precursors containing such excited precursor as being accompanied with an emission for its energy transition, the formation process of a photoelectric conversion layer is effectively made to proceed with a lower consumption of power energy to thereby obtain an improved photoelectric conversion layer with a uniform thickness and a desirable homogeneity and which has an excellent photoelectric conversion function.

(1) Photoelectromotive Force Member

[FIGS. 2(A) through 2(C)]

The photoelectromotive force members to be provided according to this invention are basically represented by those as shown in FIG. 2(A) through FIG. 2(C).

The photoelectromotive force member shown in FIG. 2(A) is of the type with which, light irradiation is conducted from the side of the substrate, and is suited for use in a photovoltaic device.

Referring to FIG. 2(A), there are shown substrate 201, semiconducting layer (p-type or n-type) 202, i-type semiconducting layer 203, semiconducting layer (n-type or p-type) 204 and conductive layer 205.

The photoelectromotive force member shown in FIG. 2(B) is of the same type as shown in FIG. 2(A) except that light irradiation is conducted from the side of the conductive layer 205. This photoelectromotive force member is also suited for use in a photovoltaic device.

Representative embodiments of the photoelectromotive force member and of the image-reading photosensor respectively having an improved light receiving element to be provided according to this invention will be hereunder explained while referring to the drawings.

Either in the case of preparing the improved light receiving element for use in photoelectromotive force member or in the case of preparing the improved light receiving element for use in image-reading photosensor, the substance A to be used must be such that can be a constituent for forming a layer but which does not or can hardly, contribute to form said layer as long as it remains in its original energy state, as previously mentioned. But it is required for the substance A to generate plural kinds of precursors containing excited precursors when it is contacted with the foregoing oxidizing agent.

And the substance A is chosen appropriately in accordance with the kind, the characteristics to be brought about, and/or the using purpose of the objective photoelectric conversion layer.

As for the substance A, any gaseous or gasifiable substance may be used as long as it meets the above conditions and it can be easily in gaseous state when contacted with the oxidizing agent.

When a liquid or solid substance is employed as the substance A, it is bubbled using an inert gas such as Ar, He, $N_2$ or $H_2$ and, if necessary, while being heated to thereby cause generating a gas of the substance, which is then introduced into a film forming space.

As for the oxidizing agent, a gaseous substance is used. There is also a requirement for the oxidizing agent. That is, the oxidizing agent must be such that has a property to easily cause an excitation for the substance A due to the electronical oxidation action of the oxidizing agent in the contact between the two substances.

Therefore, usable as such oxidizing agent are, for example, oxygen gases such as air, oxygen ($O_2$) and ozone ($O_3$), oxygen-atom-containing substances or nitrogen-atom-containing substances such as dinitrogen oxide ($N_2O$), dinitrogen trioxide ($N_2O_3$) and dinitrogen tetroxide ($N_2O_4$) peroxides such as hydrogen peroxide ($H_2O_2$), halogen gases such as $F_2$, $Cl_2$, $Br_2$ and $I_2$, and others than these, nascent state halogens such as nascent state fluorine, chlorine and iodine.

In the case where a liquid or solid substance is chosen as the oxidizing agent, it is bubbled using an inert gas such as Ar, He, $N_2$ or $H_2$ and if necessary, while being heated to thereby cause generating a gas of the substance, which is then introduced into the film forming space in the same way as in the case of the substance A.

The aforementioned substance A and the aforementioned oxidizing agent are introduced separately through respective transporting passage into a film forming space with an appropriate flow rate and under an appropriate pressure condition and collided each other to cause chemical reaction between the two substances to thereby make the substance A oxidized with the oxidizing agent to effectively generate plural kinds of precursors containing excited precursors. And at least one kind of those resulting precursors is directed to form a deposited film to be a photoelectric conversion layer on a substrate placed while being maintained at a predetermined temperature in the film forming space.

In the above film forming process, the excited precursor generated therein becomes another kind of precursor or another kind of excited precursor through successive decomposition or chemical reaction, or it sometimes liberates energy. However, the excited precursor comes to the result to touch the surface of the substrate placed while being maintained at a predetermined temperature in the film forming space and bring about the formation of a deposited film having a three dimensional network structure on the substrate. In this system, the energy level of the excited precursor generated as a result of the chemical reaction between the substance A and the oxidizing agent is preferred to be either such that is it transitions to a lower energy level or such that it is accompanied with an emission during the process when the excited precursor be changed into other kind chemical species.

The photoelectromotive force member shown in FIG. 2(C) has an i-type semiconducting layer (photoconductive layer), an insulative layer and a metallic layer, and is of the type that light irradiation is conducted from the side of the metallic layer. This photoelectromotive force member is also suited for use in a photovoltaic device.

Referring to FIG. 2(C), there are shown substrate 201, i-type semiconducting layer 203, insulative layer 206 and metallic layer 207.

In any of the photoelectromotive force members shown in FIG. 2(A) through FIG. 2(C), the substrate 201 may be either electroconductive or electrically insulative. The shape of the substrate 201 may be optionally determined. Examples of the shape are a drum, belt, plate and the like.

The thickness of the substrate is optional. But it is usually not less than 10 microns in consideration of the fabrication and handling or mechanical strength of the substrate. The substrate 201 may be either transparent or opaque. In the case when substrate 201 is transparent, the conductive layer 205 may be opaque and light radiation is conducted from the side of the substrate 201 as shown in FIG. 2(A). In the case when the substrate 201 is opaque, the conductive layer 205 is optically transparent and the light radiation is conducted from the side of the conductive layer 205 as shown in FIG. 2(B).

Usable as the electroconductive substrate are, for example, metals such as Al, Cr, Mo, Au, Ir, Nb, Ta, V, Ti, Pt, Pd and the like, or alloys such as NiCr, stainless steel or alloys of said metals.

Usable as the electrically insulating substrate are, for example, films or sheets of synthetic resin such as polyester, polyethylene, polycarbonate, cellulose acetate, polypropylene, polyvinyl chloride, polyvinylidene chloride, polystyrene, polyamide and the like, other than these, glass or ceramics. For the electrically insulating substrate, it is desirable that at least one surface thereof is conductivized and a suitable layer is formed on the conductivized surface of the substrate.

For example, in the case of glass, its surface may be conductivized by fixing a thin layer of a metal such as NiCr, Al, Cr, Mo, Au, Ir, Nb, Ta, V, Ti, Pt, Pd, $In_2O_3$, $SnO_2$, ITO ($In_2O_3+SnO_2$), etc. And in the case of synthetic resin film such as polyester film, etc., its surface may be conductivized with a metal such as NiCr, Al, Ag, Pd, Zn, Ni, Au, Cr, Mo, Ir, Nb, Ta, V, Ti, Pt, etc., in accordance with vacuum vapor deposition technique, electron beam vapor deposition technique or sputtering technique. Alternatively its surface may be also conductivized by laminating it with one of said metals.

The semiconducting layer 202 in the photoelectromotive force members as shown in FIG. 2(A) and FIG. 2(B) is composed of an amorphous silicon material containing silicon atoms (Si) as the main component and at least one kind selected from hydrogen atoms (H) and halogen atoms (X) (hereinafter referred to as "a-Si(H,X)").

And in the case when the semiconducting layer is of a p-type, it further contains p-type impurities to impart a p-type conduction.

Further in the case of the photoelectromotive force member as shown in FIG. 2(A) with which light irradiation is conducted from the side of the substrate 201, the semiconducting layer 202 is desired to bring about the so-called window-effect.

In that case, the semiconducting layer 202 is composed of a widely-band-gapped amorphous silicon material containing at least one kind selected from oxygen atoms (O), carbon atoms (C) and nitrogen atoms (N) as a band-gap adjusting element and p-type impurities in a-Si(H,X) (hereinafter referred to as "a-Si(H,X)(O,C,N)").

On the other hand, in the case of the photoelectromotive force member as shown in FIG. 2(B) with which light irradiation is conducted from the side of the electroconductive layer 205, the semiconducting layer is an n-type imparting an n-type conduction, and therefore contains n-type impurities.

In any case, the thickness of the semiconducting layer 102 is preferably 30 to $1\times10^4$ Å, more preferably 50 to $5\times10^3$ Å, and, most preferably, 50 to $1\times10^3$ Å.

As the p-type impurity to be used for making the semiconducting layer 202 to be in a p-type, there are, for example, elements of Group IIIA of the Periodic Table such as B, Al, Ga, In, Tl and the like. Among these elements, B and Ga are most preferred.

As the n-type impurity to be used for making the semiconducting layer 202 to be in an n-type, there are, for example, elements of Group VA of the Periodic Table such as N, P, As, Sb, Bi and the like. Among these elements, As, P and Sb are most preferred.

The incorporation of these p-type or n-type impurities into the semiconducting layer 202 is carried out by doping the layer with suitable impurities during its formation process. The amount of such impurities incorporated into the semiconducting layer 202 is appropriately determined having due regard to the related factors required for that layer such as electric characteristics, optical characteristics and the like. Commonly, it is less than $3\times10^{-2}$ atomic % for the p-type impurity less than $5\times10^{-3}$ atomic % for the n-type impurity.

Now, for the i-type semiconducting layer 203 in the photoelectromotive force member as shown in FIG. 2(A) or FIG. 2(B) and also for the photoconductive layer 203 in the photoelectromotive force member as shown in FIG. 2(C), they are of a multi-layer structure possessing a multi-band gap and have photoconductive characteristics to bring about a sufficient photoelectromotive function.

And each of the layer comprises a layer region constituted by an amorphous silicon material containing silicon atoms (Si), nitrogen atoms (N) as a band-gap adjusting element, and at least one kind selected from hydrogen atoms (H) and halogen atoms (X) (hereinafter referred to as "a-SiN(H,Xl)", a layer region constituted by a-Si(H,X) and/or a layer region constituted by an amorphous silicon material containing silicon atoms (Si), germanium atoms (Ge), and at least one kind selected from hydrogen atoms (H) and halogen atoms (X) (hereinafter referred to as "a-SiGe(H,X)").

The thickness of these i-type semiconducting layers is determined appropriately having due regard to the related factors not only in the relationship between the thickness of the p-type semiconducting layer and the thickness of the n-type semiconducting layer but also in the quantitive relationship between the amount of the impurities with which the p-type semiconducting layer is doped and the amount of the impurities with which the n-type semiconducting layer is doped so as to make the most of each of the functions of the three layers concerned. However, in usual the case, the thickness of the i-type semiconductive layer is preferred to be several times to some tens of times as much as that of the p-type semiconducting layer or that of the n-type semiconducting layer.

As the detailed numerical value in this regard, it is preferably 100 Å to 10 μm and more preferably 0.1 to 1.0 μm.

The semiconducting layer 204 is an n-type semiconducting layer in the photoelectromotive force member shown in FIG. 2(A) and a p-type semiconducting layer in the photoelectromotive force member shown in FIG. 2(B).

Although the principal component is a-Si(H,X) in any case, the semiconducting layer in the type of FIG. 1(B) is composed of a-Si(H,X)(O,C,N) possessing a wide band gap since it is to bring about the so-called window-effect.

And the former semiconducting layer contains doped n-type impurities and the latter semiconducting layer contains doped p-type impurities.

In order to make the layer structure of the semiconducting layer to possess a wide band gap, it is common that the p-type semiconducting layer is selected. However, it is possible to do so not on the p-type semiconducting layer but on the n-type semiconducting layer. And the extent of such wide band gap is desired to be larger than that of the i-type semiconducting layer.

The electroconductive layer 205 may be of either transparent material or opaque material. Particularly when the substrate 201 is opaque as shown in FIG. 2(B), in which case the radiation of a light is conducted from the side of the substrate 201, it is necessary for the electroconductive layer 205 to be optically transparent or to be nearly in that state in order for the photoelectromotive force member to give a sufficient photoelectric conversion effect.

As the transparent electroconductive material to form the electroconductive layer 205, there may be illustrated alloys such as $In_2O_3$, $SnO_2$ and ITO ($In_2O_3+SnO_2$), and metals such as Pd, Pt, Cu, Ag, Au and Al. As the opaque electroconductive materials to form the electroconductive layer 205, there may be illustrated alloys such as NiCr, and metals such as Al, Cr, Mo, Au, Ir, Nb, Ta, V, Ti, Pt, Pd, Zn and Ag.

Regarding the photoelectromotive force member shown in FIG. 2(C) provided according to this invention, it has a structure composed of photoconductive layer 203, insulative layer 206 in case where necessary and metallic layer 207 on substrate 201 for a photoelectromotive force member.

As the substrate 201, those as above mentioned may be used. And the photoconductive layer 203 is the same as in the case of FIG. 2(A) or FIG. 2(B).

For the metallic layer 207, a metal such as Au, Pt, Pd or the like which has a large work function is used in order to make a Schottky contact with the photoconductive layer 203. The formation of the metallic layer 208 on the substrate 201 may be conducted in accordance with vacuum vapor deposition technique or electron beam vapor deposition technique.

The thickness of the metallic layer 207 is preferred to be less than 500 Å, because light radiation is brought to the photoconductive layer 203 through the metallic layer 207.

The insulative layer 206 is disposed to reinforce a barrier between the photoconductive layer 203 and the metallic layer 207. Therefore it is not always necessary. And the thickness of the insulative layer 207 will be sufficient to be extremely thin, for example, less than 2000 Å.

In the case when the insulative layer 207 is disposed in the photoelectromotive force member, it is preferred to be wide-band-gapped.

The formation of the insulating layer 209 may be conducted by adding a gas containing a nitrogen source such as $N_2$, $NH_3$, NO or $NO_2$, a gas containing an oxygen source such as $O_2$ or $CO_2$, or a gas containing a carbon source such as $CF_4$, $C_2F_6$ or $CH_4$ to either the foregoing substance A or the foregoing oxidizing agent.

The photoelectromotive force members as explained above which are provided according to this invention have a wealth of excellent electric and optical characteristics, deterioration resistance upon repeating use and use-environmental characteristics and have a higher photoelectric conversion efficiency.

Now, in the formation of the light receiving element in any of the above photoelectromotive force members, the combination of the substance A and the oxidizing agent is appropriately selected according to the kind of a photoelectric conversion layer to be formed on the substrate.

For example, in the case of forming the semiconducting layer composed of a p-type a-Si(O,C,N) (H,X), as the substance A, in addition to a gaseous or gasifiable compound containing silicon atoms such as a silicon hydride (silane) i.e., $SiH_4$, $Si_2H_6$, $Si_3H_8$ and $Si_4H_{10}$ or a gaseous or gasifiable halogen-substituted silicon halide, i.e., $SiH_3Cl$, $SiH_3F$ and $SiH_3F$, there is used a gaseous or gasifiable compound containing nitrogen atoms such as $N_2$, $NH_3$, $H_2NNH_2$ and $NH_4N_3$ or a gaseous or gasifiable compound containing carbon atoms such as $CH_4$, $C_2H_2$, $C_2H_4$, $C_2H_6$, $C_3H_6$ and $C_3H_8$. In addition, as the substance to impart a p-type impurity, there is used a compound containing a Group III element such as $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$ and $In(CH_3)_3$.

As the electronically oxidizing agent, there is used at least one kind selected from the group consisting of a halogen gas such as $F_2$, $Cl_2$, $Br_2$ and $I_2$, a nascent state halogen such as nascent state fluorine, chlorine and iodine, an oxygen gas such $O_2$ and $O_3$ and a nitrogenic gaseous substance such as $N_2O_4$, $N_2O_3$ and $N_2O$.

In the case of forming the i-type semiconducting layer composed of a-Si(O,C,N)(H,X), as the starting substance A, in addition to a gaseous or gasifiable compound containing silicon atoms selected from those silicon compounds as mentioned above, there is used at least one kind selected from the above mentioned compounds containing nitrogen atoms and the above mentioned compounds containing carbon atoms.

As the oxidizing agent, there is used at least one kind selected from the above mentioned halogen gases, nascent state halogens, oxygen gases and gaseous nitrogenic substances.

Further, in the case of forming the n-type semiconducting layer composed of a-Si(H,X), as the substance A, there is used a gaseous or gasifiable compound containing silicon atoms selected from those silicon compounds as mentioned above together with a compound containing a Group V element to impart an n-type impurity such as $PH_3$, $P_2H_4$, $AsH_3$, $SbH_3$ and $BiH_3$.

And as the oxidizing agent, there is used at least one kind selected from the above mentioned halogen gases, nascent state halogens, oxygen gases and gaseous nitrogenic substances.

Further in addition, in the case of forming the p-type, i-type or n-type semiconducting layer composed of a-SiGe, as the starting substance A, there is used a linear germanium compound for incorporating germanium atoms such as $GeH_4$, $Ge_2H_6$, $Ge_3H_8$, $Ge_4H_{10}$ and $Ge_5H_{12}$ in addition to the other substance A to be used in the formation of respective layer.

In the process for preparing an improved photoelectromotive force member according to this invention, the conditions upon forming the corresponding photoelectric conversion layer, for example, the combination of the substance A with the oxidizing agent, their mixing ratio, the gas pressure upon mixing those substances in the film forming space, their gas flow rates, the internal pressure upon forming the layer on the substrate, the carrier gas flow rate, the temperature of the substrate and the flow type of each gaseous substance when introduced into the film forming space are important factors for obtaining a desirable layer having desired characteristics, and they are appropriately selected while considering the functions of the layer to be formed. Further, since these layer forming conditions are organically correlated and may be varied depending upon the kind and the amount of each of the atoms contained in the layer, the conditions are to be determined taking these relationships into consideration.

The volume ratio of the substance A to the oxidizing agent on the basis of the flow ratio is preferably 1/100 to 100/1, and more preferably, 1/50 to 50/1.

As for the volume ratio of the gaseous substance containing the p-type impurity or the n-type impurity as its constituent to the substance A on the basis of the flow ratio is preferably $1/10^6$ to 1/10, more preferably, $1/10^5$ to 1/20, and most preferably, $1/10^5$ to 1/50.

The gas pressure in the film forming space when the substance A is mixed with the oxidizing agent is preferred to be higher in order to facilitate their chemical contact. But it is necessary to be determined with due regard to their reactivities. Therefore, it is preferably $1 \times 10^{-7}$ to 10 atmospheric pressure, and more preferably, $1 \times 10^{-6}$ to 3 atmospheric pressure.

The internal pressure in the film forming space, namely, the pressure of the inner space wherein the substrate is placed is appropriately determined with due regard to the excited precursors to be generated in the above inner space and to the conditions which let those precursors derived from the excited precursors to become effective in forming a deposited layer.

The internal pressure in the film forming space in the case where the reaction region is open-connected to the film forming region can be adjusted with the use of a differential exhausting means or a large scale exhausting device while having due regard to the correlated conditions relating to the introducing pressure and the introducing flow rate for each of the gaseous substance A, the oxidizing agent and the gaseous starting substance to impart a p-type or n-type impurity when they are introduced into the reaction region of the film forming space.

In the case where the conductance of the connecting part between the reaction region and the film forming region is relatively small, the internal pressure in the film forming region can be adjusted by controlling the amount of the exhausting gas by operating an exhausting device being connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming space is determined while having a due regard on the correlative pressure conditions in introducing the starting substance A, the electronically oxidizing agent and the substance to impart p-type or n-type impurities into the film forming space.

However, in general, the internal pressure is preferably 0.001 to 100 Torr, more preferably, 0.01 to 30 Torr, and most preferably, 0.05 to 10 Torr.

As for the form of the gas flow into the film forming space for each of the foregoing substances, they are appropriately designed with due regard to the geometrical arrangement of the gas flow inlet, the substrate and the gas flow outlet so that the substance A, the oxidizing agent and the substance to impart p-type or n-type impurities are effectively introduced into, and homogeneously and well mixed in the predetermined region of the film forming space to generate desired precursors and to bring about the effective formation of a deposited film on the substrate.

The temperature of the substrate upon forming a deposited film thereon is properly determined according to the kind of a gaseous substance to be employed and also to the kind of a deposited film to be formed.

That is, in the case of forming a deposited film composed of an amorphous material, it is preferably room temperature to 450° C., more preferably, 50° to 350° C., and most preferably, 70° to 350° C.

The atmospheric temperature in the film forming space is properly determined with due regard to the temperature of the substrate so that desired precursors are effectively generated, and those precursors as generated and other precursors derived from the former precursors are not changed into undesired things during the film forming process in the film forming space.

(2) Image-Reading Photosensor

Figure 3A:
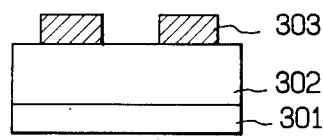
Figure 3B:
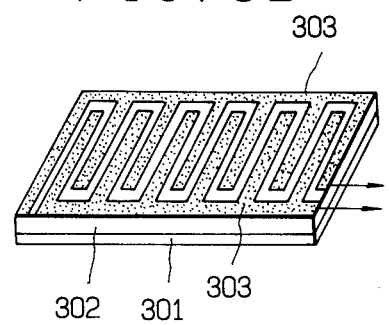
Figure 3C:
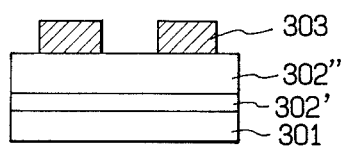
Figure 3D:
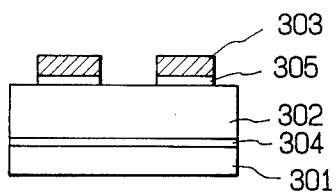
Figure 3E:
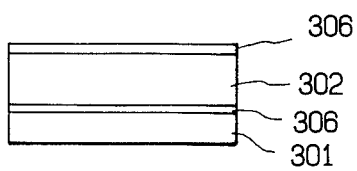

FIG. 3(A) through FIG. 3(E) are schematic portion views for illustrating representative embodiments of the image-reading photosensor having an improved light receiving element to be provided according to this invention, in which FIG. 3(A) is a cross-sectional portion view of a first representative embodiment of the image-reading photosensor according to this invention;

FIG. 3(B) is a squint-eyed view for illustrating the whole body of the embodiment as shown in FIG. 3(A);

FIG. 3(C) is a cross-sectional portion view of a second representative embodiment of the image-reading photosensor according to this invention;

FIG. 3(D) is a cross-sectional portion view of a third representative embodiment of the image-reading photosensor according to this invention; and FIG. 3(E) is a cross-sectional portion view of a fourth representative embodiment of the image-reading photosensor according to this invention.

The image-reading photosensors as shown in FIGS. 3(A), 3(C) and 3(D) are of the type that the radiation of a light is conducted from the side of the substrate, in which are shown substrate 301, photoelectric conversion layer 302, constituting layers of the photoelectric conversion layer 302' and 302", gap type electrode 303, under coat layer 304 and ohmic contact layer 305.

The image-reading photosensor as shown in FIG. 3(E) is of the type that the radiation of a light is conducted from the side of the substrate and also from the side of the photoelectric conversion layer, in which are shown transparent substrate 301, photoelectric conversion layer 302 and transparent electrode 306.

In any of the above image-reading photosensors, the substrate 101 is electrically insulative.

The electrically insulative substrate can include, for example, film or sheet of synthetic resins such as polyester, polyethylene, polycarbonate, cellulose acetate, polypropylene, polyvinyl chloride, polyvinylidene chloride, polystyrene, and polyamide; glass, ceramics, and paper.

The thickness of the substrate is properly determined so that the image-reading photosensor as desired can be obtained. However, the thickness is usually greater than 10 $\mu$m in view of the fabrication and handling or mechanical strength of the substrate.

The photoelectric conversion layer comprises a semiconductive non-monocrystalline material, preferably, an amorphous material containing silicon atoms (Si) as the main constituent, and if necessary at least one of hydrogen atoms (H) and halogen atoms (X) (hereinafter referred to as "a-Si (H,X)"). Also, optionally, containing electroconductive substances.

The halogen atom (X) includes, specifically, fluorine, chlorine, bromine and iodine, fluorine and chlorine being particularly preferred. The amount of the hydrogen atoms (H), the amount of the halogen atoms (X) or the sum of the amounts for the hydrogen atoms and the halogen atoms (H+X) contained in the photoelectric conversion layer 302 is usually from 1 to 40 atm % and, preferably, from 5 to 30 atm %.

And in the case when only the halogen atom (X) is contained in the photoelectric conversion layer 302, its amount is preferably at least 0.001 atomic %, more preferably, 0.01 atomic % and most preferably, 0.1 atomic %.

It is possible to make the photoelectric conversion layer 302 either n-type or p-type by appropriately doping the layer with an n-type impurity or a p-type impurity while controlling the impurity amount when the layer is being formed.

Usable as impurities are, for example, elements of Group IIIA of the Periodic Table such as B, Al, Ga, In, Tl and the like for the p-type impurity, and elements of Group VA of the Periodic Table such as N, P, As, Sb, Bi and the like for the n-type impurity. Of these impurities, B, Ga, P and Sb are the most appropriate.

In order for the photoelectric conversion layer 302 to have a desired type conductivity, the amount of an impurity with which the layer 302 is doped may be determined appropriately depending upon its desired electrical and optical characteristics.

For the impurities of Group IIIA of the Periodic Table, the amount used is less than $3 \times 10^{-2}$ atomic %, and in the case of the impurities of Group VA of the Periodic Table, the amount used is less than $5 \times 10^{-3}$ atomic %.

In addition, the photoelectric conversion layer 302 of the image-reading photosensor according to this invention may be of a multi-layered structure possessing an optical multi-band gap.

FIG. 3(C) illustrates a typical embodiment in that case, in which the photoelectric conversion layer is composed of layer 302' and layer 302".

The formation of such multi-layered photoelectric conversion layer possessing optical multi-band gaps may be carried out by introducing at least one kind selected from oxygen atoms (O), carbon atoms (C), nitrogen atoms (N), germanium atoms (Ge) and tin atoms (Sn) as the band gap adjusting element into the layer during its formation process.

That is, in one example of the embodiment shown in FIG. 3(C), the layer 302' is composed of a-Si(H,X) containing at least one kind selected from oxygen atoms (O), carbon atoms (C), nitrogen atoms (N), germanium atoms (Ge) and tin atoms (Sn) [hereinafter referred to as "a-Si(O,C,N,Ge,Sn)(H,X)"] and the layer 302" is composed of a-Si(H,X) not containing any of the above elements or containing one or more elements different from those contained in the layer 302' or containing the same kind elements as those contained in the layer 302'.

The aforesaid multi-layered photoelectric conversion layer possessing an optical multi-band gap may be also formed by varying the film formation rate of a deposited film to be formed on the substrate. For example, the formation of the layer 302' is carried out at a high film formation rate then the formation of the layer 302" is carried out at a low film formation rate.

In a case of the embodiments of the image-reading photosensor according to this invention as shown in FIGS. 3(A), 3(C), 3(D) and 3(E), the thickness of the photoelectric conversion layer is selected depending upon the requirements for the photoelectric conversion layer of the image-reading photosensor to be prepared. In general, the thickness of the photoelectric conversion layer is preferably 0.05 to 100 $\mu$m, more preferably, 0.1 to 50 $\mu$m, and, most preferably, 0.5 to 30 $\mu$m.

In the image-reading photosensor according to this invention, there may be disposed an under coat layer 304 between the substrate 301 and the photoelectric conversion layer 302 in the way as shown in the embodiment of FIG. 3(D). As the under coat layer, there can be mentioned a layer composed of a-Si(H,X) containing nitrogen atoms namely a-SiN(H,X) or $Si_3N_4$.

The gap type electrode 303 in the image-reading photosensor according to this invention is composed of a conductive material. And the electrode is preferred to be such that conducts an ohmic contact with the photoelectric conversion layer 302.

As the conductive material to bring about said ohmic contact, a metal having a lower work function such as Al and In or a lower resistive film composed of a-Si(H,X) doped with a large amount (usually more than 100 ppm) of an element of Group V of Periodic Table such as P or As may be used in the case of using a nondoped film composed of a-Si(H,X) as the photoelectric conversion layer. However, as an alternative, as shown in FIG. 3(D), there can be disposed an ohmic contact layer 305 composed of a-Si(H,X) doped with a large amount of an element of Group V between the electrode 303 composed of a conductive material such as Al and the photoelectric conversion layer 302.

In addition, in the case of the image-reading photosensor shown in FIG. 3(E) for which the radiation of a light is conducted from the side of the substrate 301 and also from the side of the photoelectric conversion layer 302, a transparent electrode composed of $In_2O_3$ is disposed between the transparent substrate 301 and the photoelectric conversion layer 302 and also on the photoelectric conversion layer 302.

In any case of the embodiments of the image-reading photosensor according to this invention as shown in FIGS. 3(A), 3(C), 3(D) and 3(E), there can be disposed an insulative layer (not shown) onto the top surface. Usable as the constituent material for the insulative layer are, for example, a-Si(H,X) containing nitrogen atoms, insulative inorganic materials such as $Si_3N_4$ and insulative organic resins.

And it is also possible to dispose a gap type electrode on the substrate first and then a photoelectric conversion layer (not shown) thereon.

For the preparation of such image-reading photosensor according to this invention, not only the photoelectric conversion layer 302 containing a-Si(H,X) as the main constituent but also the under coat layer 304 comprising a-SiN(H,X) and the insulative layer comprising a-SiN(H,X) can be formed respectively in accordance with the foregoing procedures. And in the formation of these layers, there can be obtained a desirable layer having many practically applicable characteristics to meet the requirements for the layer by selecting the proper kind of the substance A and that of the oxidizing agent and an appropriate combination thereof and introducing them separately into the film forming space as previously mentioned.

That is, in the case of forming a relevant layer composed of a-Si(H,X), a gaseous or gasifiable silicon hydride (silane) such as $SiH_4$, $Si_2H_6$, $Si_3H_8$ and $Si_4H_{10}$ or a gaseous or gasifiable halogen-substituted silicon hydride such as $SiH_3Cl$, $SiH_3F$ and $SiH_3Br$ may be preferably used as the substance A.

And as the oxidizing agent in that case, a halogen gas such as $F_2$, $Cl_2$, $Br_2$ and $I_2$ or a nascent state halogen such as nascent state fluorine, chlorine and iodine may be preferably used. And among these substances, $F_2$ gas and $Cl_2$ gas are most preferred.

And in the case of forming a relevant layer composed of a-Si(H,X) containing p-type impurities, an appropriate starting substance to impart such p-type impurities is used in addition to the foregoing two substances.

Usable as such starting substance are, for example, compounds containing the Group III atoms as their constituents such as $B_2H_6$, $B_4H_{10}$, $B_5H_9$, $B_6H_{10}$, $B_6H_{12}$, $Al(CH_3)_3$, $Al(C_2H_5)_3$, $Ga(CH_3)_3$ and $In(CH_3)_3$. Among these compounds, $B_2H_6$ is most preferred.

Further in the case of forming a relevant layer composed of a-SiH,X) containing n-type impurities, an appropriate starting substance to impart such n-type impurities is used in addition to the foregoing two substances.

Usable as such starting substance are, for example, compounds containing Group V elements as their constituents such as $PH_3$, $P_2H_4$, $AsH_3$, $SbH_3$ and $BiH_3$. Among these compounds, $PH_3$ is most preferred.

In the case of forming a relevant layer composed of a-Si(O,C,N,Ge,Sn)(H,X), there is used a gaseous or gasifiable compound containing nitrogen atoms as its constituent such as $N_2$, $NH_3$, $H_2NNH_2$, $HN_3$ or $NH_4N_3$, or a gaseous or gasifiable hydrocarbon compound such as $CH_4$, $C_2H_2$, $C_2H_4$, $C_2H_6$, $C_3H_6$ or $C_3H_8$, or a gaseous or gasifiable germane such as $G_2H_4$, $Ge_2H_6$, $Ge_3H_8$, $Ge_4H_{10}$ or $Ge_5H_{12}$, or $SnH_4$ in stead of part of the foregoing silane or halogen-substituted silicon hydride as the substance A. And as the oxidizing agent, at least one kind of oxygen gas or of nitrogen gas selected from $O_2$, $O_3$, $N_2O$, $N_2O_3$ and $N_2O_4$.

In the process for preparing an improved image-reading photosensor according to this invention, the conditions upon forming the photoelectric conversion layer and other layers, for example, the combination of the substance A with the oxidizing agent, their mixing ratios, the gas pressure upon mixing those substances in the film forming space, their gas flow rates, the internal pressure upon forming a layer on the substrate, the carrier gas flow rate, the temperature of the substrate and the flow type of each gaseous substance when introduced into the film forming space are important factors for obtaining the image-reading photosensor having desired characteristics and they are appropriately selected while considering the functions of the layer to be formed. Further, since these layer forming conditions are organically correlated and may be varied depending upon the kind and the amount of each of the atoms contained in the layer, the conditions are to be determined taking these relationships into consideration.

The volume ratio of the substance A to the oxidizing agent on the basis of the flow ratio is preferably 1/100 to 100/1, and more preferably, 1/50 to 50/1.

As for the volume ratio of the gaseous substance containing the p-type impurity or the n-type impurity as its constituent to the substance A on the basis of the flow ratio is preferably $1/10^6$ to 1/10, more preferably, $1/10^5$ to 1/20, and most preferably, $1/10^5$ to 1/50.

The gas pressure in the film forming space when the substance A is mixed with the oxidizing agent is preferred to be higher in order to facilitate their chemical contact. But it is necessary to be determined with due regard to their reactivities. Therefore, it is preferably $1 \times 10^{-7}$ to 10 atmospheric pressure, and more preferably, $1 \times 10^{-6}$ to 3 atmospheric pressure.

The internal pressure in the film forming space, namely, the pressure of the inner space wherein the substrate is placed is appropriately determined with due regard to the excited precursors to be generated in the above inner space and to the conditions which let those precursors derived from the excited precursors to become effective in forming a deposited layer.

The internal pressure in the film forming space in the case where the reaction region is open-connected to the film forming region can be adjusted with the use of a differential exhausting means or a large scale exhausting device while having due regard to the correlated conditions relating to the introducing pressure and the introducing flow rate for each of the gaseous substance A, the gaseous oxidizing agent and the gaseous starting substance to impart a p-type or n-type impurity when they are introduced into the reaction region of the film forming space.

In the case where the conductance of the connecting part between the reaction region and the film forming region is relatively small, the internal pressure in the film forming region can be adjusted by controlling the amount of the exhausting gas by operating an exhausting device being connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming space is determined while having a due regard on the correlative pressure conditions in introducing the substance A, the oxidizing agent and the substance to impart p-type or n-type impurities into the film forming space.

However, in general, the internal pressure is preferably, 0.001 to 100 Torr, more preferably, 0.01 to 30 Torr, and most preferably, 0.05 to 10 Torr.

As for the form of the gas flow into the film forming space for each of the foregoing substances, they are appropriately designed with due regard to the geometrical arrangement of the gas flow inlet, the substrate and the gas flow outlet so that the substance A, the oxidizing agent and the substance to impart p-type or n-type impurities are effectively introduced into and homogeneously and well mixed in the predetermined region of the film forming space to generate desired precursors and to bring about the effective formation of a deposited film on the substrate.

The temperature of the substrate upon forming a deposited film thereon is properly determined according to the kind of a gaseous substance to be employed and also to the kind of a deposited film to be formed.

That is, in the case of forming a deposited film composed of an amorphous material, it is preferably room temperature to 450° C., and more preferably, 50° to 450° C. Specifically, in the case of forming a deposited film composed of a-Si(H,X) having a desired photoelectric conversive characteristic, it is preferred to be 70° to 350° C. And, in the case of forming a deposited film composed of a polycrystalline material, it is preferably 200° to 650° C., and more preferably, 300° to 600° C.

The atmospheric temperature in the film forming space is properly determined with due regard to the temperature of the substrate so that desired precursors are effectively generated, and those precursors as generated and other precursors derived from the former precursors are not changed into undesired things during the film forming process in the film forming space.

The advantages of this invention will be now described in more detail while referring to the following Example 1 and 2 which are provided here for illustrative only, and are not intended to limit the scope of this invention.

EXAMPLE 1

A photoelectromotive force member of the p-i-n type as shown in FIG. 2(A) was prepared using the apparatus shown in FIG. 2.

In this example, the distance between the outlet of the gas supplying conduit (111, 111', 111'') of the concentric triplicate conduit and the surface of a substrate was adjusted to be 3 cm in the respective reaction chambers A, B and C.

As the substrate, a glass plate of 1 mm in thickness and 10 cm×5 cm in size on which an $SnO_2$ film or 1000 Å in thickness was formed according to the conventional CVD method was used.

The thus treated glass plate was placed on the substrate conveying belt 122 in the front of the reaction chamber A. The glass plate was then moved to a predetermined position on the substrate holder 112 by opening the gate 125 and starting up the wind roll 124. Thereafter, shutting the gate 125 and stopping the wind roll 124, the air in the reaction chamber A was evacuated by opening the exhaust valve 119 to bring the space to a vacuum of about $10^{-5}$ Torr.

At the same time, the heater 113 was actuated to heat uniformly the glass plate (118) to about 250° C., and the glass plate was maintained at this temperature.

Under this condition, $SiH_4$ gas from the reservoir 101 and $CH_4$ gas from the reservoir 102 were fed into the reaction region (a) of the reaction chamber A through the gas supplying conduit 109 respectively at a flow rate of 20 SCCM and 3 SCCM. And, a gas containing 3000 ppm of $B_2H_6$ in He gas (hereinafter referred to as "$B_2H_6$/He gas") from the reservoir 103 was fed into the reaction region (a) through the gas supplying conduit 110 at a flow rate of 10 SCCM.

At the same time, He gas from the reservoir 107 was fed into the reaction region (a) through the gas supplying conduit 111 at a flow rate of 30 SCCM.

After the flow amounts of the gases became stable, the vacuum in the reaction chamber A was brought to and maintained at about 0.8 Torr by regulating the exhaust valve 119. Then, $F_2$ gas from the reservoir 106 was fed into the reaction region (a) through the gas supplying conduit 111 at a flow rate of 2 SCCM. Wherein, there was observed a strong blue luminescence particularly in the region where $SiH_4$ gas and $F_2$ gas were being mixed.

After 4 minutes, it was found that a p-type a-SiC:H:F:B semiconducting layer of about 300 Å in thickness was uniformly formed on the $SnO_2$ layer previously formed on the glass plate.

After the feedings of all the gases were terminated, the airs in the reaction chambers A and B were evacuated by opening the exhaust valves 119 and 119' to bring their spaces to a vacuum of about $10^{-5}$ Torr. Then, by opening the gate 126 and starting up the wind roll 124, the substrate conveying belt 122 was moved to place the glass plate having the p-type a-SiC:H:F:B semiconducting layer thereon to a predetermined position on the substrate holder 112'. In this case, since the internal atmosphere of the reaction chamber A and the internal atmosphere of the reaction chamber B were maintained at uniform pressure condition, mixing the airs of the two chambers was not occurred (In this example, the two chambers were simultaneously exhausted, but as long as the internal atmospheres of the two chambers are maintained at uniform pressure condition, it is possible to move the substrate into the reaction chamber B from the reaction chamber A without occurrence of the mixture of the airs of the two chambers.)

When the glass plate arrived at the position mentioned by the numeral 118', the gate 126 was shut and the wind roll 124 was stopped, then the heater 113' was actuated to heat the glass plate (118') to about 250° C. and the glass plate was maintained at this temperature.

Under this condition, $SiH_4$ gas from the gas reservoir 101 and He gas from the gas reservoir 107 were simultaneously fed into the reaction region (b) of the reaction chamber B respectively through the gas supplying conduits 109' and 111' at a flow of 20 SCCM and 30 SCCM.

After the flow amounts of the gases became stable, the vacuum in the reaction chamber B was brought to and maintained at about 0.8 Torr by regulating the exhaust valve 119'. Then, $F_2$ gas from the gas reservoir 106 was fed into the reaction region (b) through the gas supplying conduit 111' at a flow rate of 5 SCCM.

After 1 hour, it was found that an i-type semiconducting layer composed of a-Si:H:F of about 5000 Å in thickness was uniformly formed on the p-type a-SiC:H:F:B semiconducting layer.

Finally, an n-type semiconducting layer composed of a-Si:H:F:P was formed on the i-type a-Si:H:F semiconducting layer by using $SiH_4$ gas as the substance A, $PH_3$ gas as the substance to impart n-type impurities, and $F_2$ gas as the oxidizing agent.

That is, after the feedings of all the gases were terminated, the airs in the reaction chambers B and C were evacuated by opening the exhaust valves 119' and 119'' to bring their spaces to a vacuum of about $10^{-5}$ Torr. Then, by opening the gate 127 starting up the wind roll 124, the substrate conveying belt 122 was moved to place the glass plate (118') to a predetermined position on the substrate holder 112''.

When the glass plate (118') arrived at the position mentioned by the numeral 118'', the gate 127 was shut and the wind roll 124 was stopped, then the heater 113" was actuated heat the glass plate (118") to about 250° C. and the glass plate was maintained at this temperature.

Then, SiH$_4$ gas from the gas reservoir 101 and a gas containing 5000 ppm of PH$_3$ in He gas from the gas reservoir 104 were fed into the reaction region (c) of the reaction chamber C respectively through the gas supplying conduits 109" and 110" at a flow rate of 20 SCCM and 10 SCCM. At the same time, He gas from the gas reservoir 107 was fed into the reaction region (c) through the gas supplying conduit 111" at a flow rate of 30 SCCM.

After the flow amounts of the gases became stable, the vacuum in the reaction chamber C was brought to and maintained at about 0.8 Torr by regulating the exhaust valve 119".

Then, F$_2$ gas from the gas reservoir 106 was fed into the reaction region (c) through the gas supplying conduit 111" at a flow rate of 2 SCCM.

After 6 minutes, it was found that an i-type semiconducting layer composed of a-Si:H:F:P of about 500 Å was uniformly formed on the i-type a-Si:H:F semiconducting layer.

The feedings of all the gases were terminated by closing the corresponding valves, and the vacuum atmosphere in the reaction chamber C was released to atmospheric pressure by opening the exhaust valve 119".

After the glass plate having three kinds of semiconducting layers thereon being cooled to room temperature, it was taken out from the reaction chamber C by opening the gate 128 and moving the substrate conveying belt 122.

The glass plate was then placed in another vacuum chamber (not shown), and a comb line Al electrode of about 500 Å in thickness was formed on the surface of the top layer of the glass plate in accordance with the conventional vacuum deposition method to obtain an objective photovoltaic device of p-i-n type as shown in FIG. 2(A).

When the resulting photovoltaic device was examined, it was found that any of the layers as formed on the glass plate is uniform and homogeneous and has many practically applicable characteristics.

Further, when the resulting photovoltaic device was examined by irradiating a light of AM-1 100 mW/cm$^2$ from the side of the glass plate, it was found that the photovoltaic device has excellent photovoltaic characteristics; 0.80 V for release voltage, 18 mA/cm$^2$ for short-cut current, and 8.0% for photoelectric conversion efficiency.

EXAMPLE 2

An image-reading photosensor of the type as shown in FIG. 3(D) which comprises a glass plate (substrate), an under coat layer composed of an a-SiN:H:F, a photoelectric conversion layer composed of a-Si:H:F, an ohmic contact layer composed an a-Si:H:F:P doped with phosphorus atoms (P), and an aluminum electrode.

In this example, the distance between the outlet of the gas supplying conduit (111, 111', 111") of the concentric triplicate conduit and the surface of the substrate (118, 118', 118") was adjusted to be 4 cm.

As the substrate 218, a glass plate of 1 mm in thickness and 10 cm×5 cm in size was used. The glass plate was treated with a 1.0% aqueous solution of NaOH, washed with distilled water and then air-dried.

The thus treated glass plate was placed on the substrate conveying belt 122 in the front of the reaction chamber A.

The glass plate was then moved to a predetermined position on the substrate holder 112 by opening the gate 125 and starting up the wind roll 124. Thereafter, shutting the gate 125 and stopping the wind roll 124, the air in the reaction chamber A was evacuated by opening the exhaust valve 119 to bring the space to a vacuum of about $10^{-5}$ Torr.

Then, the heater 113 was actuated to heat uniformly the glass plate (substrate) (118) to 200° C., and the plate was maintained at this temperature.

Under this condition, SiH$_4$ gas from the gas reservoir 101 and NH$_3$ gas from the gas reservoir 102 were fed into the reaction region (a) through the gas supplying conduit 109 respectively at a flow rate of 30 SCCM.

At the same time, He gas from the gas reservoir 107 was fed into the reaction region (a) through the gas supplying conduit 111 at a flow rate of 45 SCCM.

After the flow amounts of the gases became stable, the vacuum in the reaction chamber A was brought to and maintained at about 1.0 Torr by regulating the exhaust valve 119.

Then, F$_2$ gas from the gas reservoir 106 was fed into the reaction region (a) through the gas supplying conduit 111 at a flow rate of 5 SCCM.

Wherein, there was observed a strong blue luminescence throughout the reaction region (a) namely all over the confluent part of the gas from the gas supplying conduit 109 and the gas from the gas supplying conduit 111 and the surface of the glass plate (118).

After 3 minutes, it was found that an a-SiN:H:F film of about 1000 Å in thickness to be an undercoat layer was uniformly on the glass plate.

After the feedings of all the gases were terminated, the airs in the reaction chambers A and B were evacuated by opening the exhaust valves 119 and 119' to bring the spaces to a vacuum of about $10^{-5}$ Torr Then, by opening the gate 126 and starting up the wind roll 124, the substrate conveying belt 122 was moved to the glass plate (118) to a predetermined position on the substrate holder 112'.

When the glass plate (118) arrived at the position mentioned by the numeral 118', the gate was shut and the wind roll 124 was stopped, then the heater 113' was actuated to heat the glass plate (118') to about 200° C. and it was maintained at this temperature. Under this condition, SiH$_4$ gas from the gas reservoir 101 and He gas from the gas reservoir 107 were fed into the reaction region (b) of the reaction chamber B respectively through the gas supplying conduits 109' and 111' at a flow rate of 30 SCCM and 45 SCCM.

After the flow amounts of the gases became stable, the vacuum in the reaction chamber B was brought to and maintained at about 1.0 Torr by regulating the exhaust valve 119'.

Then, F$_2$ gas from the gas reservoir 106 was fed into the reaction region (b) through the gas supplying conduit 111' at a flow rate of 5 SCCM.

After 1 hour, it was found that a layer composed of a-Si:H:F of about 1.0 μm in thickness to be a photoelectric conversion layer was uniformly formed on the previous layer on the glass plate.

Finally, after the feedings of all the gases were terminated, the gases in the reaction chambers B and C were evacuated by opening the exhaust valves 119' and 119" to bring the spaces to a vacuum of about $10^{-5}$ Torr.

Then, by opening the gate 127 and starting up the wind roll 124, the substrate conveying belt 122 was moved to place the glass plate (118') to a predetermined position on the substrate holder 112".

When the glass plate arrived at the position by indicated the numeral 118", the gate 127 was shut and the wind roll 124 was stopped, then the heater 113" was actuated to heat the glass plate (118") to about 200° C. and it was maintained at this temperature.

Then, SiH$_4$ gas from the gas reservoir 101 and a gas containing 5000 ppm of PH$_3$ in He gas from 104 were fed into the reaction region (c) of the reaction chamber C respectively through the gas supplying conduits 109" and 110" at a flow rate of 30 SCCM and 6 SCCM. At the same time, He gas from the gas reservoir 107 was fed into the reaction region (c) through the gas supplying conduit 111" at a flow rate of 45 SCCM. After the flow amounts of the gases became stable, the vacuum in the reaction chamber C was brought to and maintained at about 1.0 Torr. Then, F$_2$ gas from the gas reservoir 106 was fed into the reaction region (c) through the gas supplying conduit 111".

After one minute, it was found that an n-type a-Si:H:F:P layer to be an ohmic contact layer of about 3000 Å in thickness was uniformly formed on said a-Si:H:F layer.

The feedings of all the gases were terminated by closing the corresponding valves, the heater was switched off, and the vacuum atmosphere in the reaction chamber C was released to atmospheric pressure by opening the exhaust valve 119".

After the glass plate had been cooled to room temperature, it was taken out from the reaction chamber C by opening the gate 128 and moving the substrate conveying belt 122. Then, the glass plate was placed in another vacuum chamber (not shown) and a comb line Al electrode of about 500 Å in thickness, 2.5 cm in gap length and 0.2 mm in gap interval was formed on the surface of the film deposited on the glass plate in accordance with the known vacuum deposition method to obtain an objective image-reading photosensor.

An electric current was measured by impressing a voltage on the resulting photosensor.

As a result, it was found that the ratio of electric current under light irradiation to electric current under a dark condition was $1 \times 10^{4.0}$. There was no change in this numerical value, even after light irradiation for 24 hours.

What we claim is:

1. An apparatus for continuously preparing a light receiving element comprising a substrate and a silicon-containing non-single-crystal semi-conductor layer formed by chemically reacting a first gaseous substance, capable of being a constituent of the layer but essentially incapable of contribution to the formation of the layer in its original energy state, and a second gaseous substance capable of electronically oxidizing the first gaseous substance for use in a photoelectromotive force member or image-reading photosensor; said apparatus comprising a plurality of reaction chambers for forming respective constituent layers of the semiconductor layer, said reaction chambers being continuously connected to each other via opening and shutting gates and a substrate conveying belt moving through said reaction chambers; each of said reaction chambers having a film-forming space, a raw material gas feed means extending through an upper wall of the reaction chamber and opening into said film-forming space, an exhaust means provided at the bottom portion of the reaction chamber, and a substrate supporting means having an upwardly and downwardly shiftable arm for supporting the substrate through said substrate conveying belt, and an electric heater for heating the substrate; said gas feed means comprising a concentric triplicate conduit terminating adjacent the substrate; said concentric triplicate conduit having an inner gas transporting conduit for transporting the first gaseous substance and two surrounding gas transporting conduits for transporting the second gaseous substance and a third gaseous substance, respectively; each of said gas transporting conduits having a respective outlet, and the outlet of said inner gas transportation conduit being encircled by the two outlets of said two transportation conduits, forming a reaction region adjacent the substrate.

2. An apparatus according to claim 1 wherein said reaction region is of a form selected from the group consisting of round form and conic trapezoidal form.

* * * * *

UNITED STATES PATENT AND TRADEMARK OFFICE
CERTIFICATE OF CORRECTION

PATENT NO. : 4,798,166
DATED : January 17, 1989
INVENTOR(S) : MASAAKI HIROOKA, ET AL.

It is certified that error appears in the above-identified patent and that said Letters Patent is hereby corrected as shown below:

COLUMN 1

Line 26, "the vacuum" should read --using the vacuum--.

COLUMN 4

Line 35, "passage into" should read --passages into--.

COLUMN 7

Line 49, "substrate a" should read --a substrate--.

COLUMN 10

Line 63, "that is it" should read --that it--.

COLUMN 12

Line 32, "impurity" should read -- impurity and --.
    Line 47, "'a-SiN(H,X11)," should read --"a-SiN(H,X"), --.
    Line 64, "in usual the case," should read
        --in the usual case, --.

COLUMN 19

Line 39, "a-SiH,X)" should read -- a-Si(H,X) --.

UNITED STATES PATENT AND TRADEMARK OFFICE
CERTIFICATE OF CORRECTION

PATENT NO. : 4,798,166

DATED : January 17, 1989

INVENTOR(S) : MASAAKI HIROOKA, ET AL.   Page 2 of 2

It is certified that error appears in the above-identified patent and that said Letters Patent is hereby corrected as shown below:

COLUMN 25

Line 5, "by indicated" should read -- indicated by --.
Line 8, "(118")" should be deleted.

COLUMN 26

Line 40, "two transportation" should read
--two gas transportation--.
Line 42, "claim 1" should read --claim 1,--.

Signed and Sealed this

Twelfth Day of September, 1989

Attest:

DONALD J. QUIGG

*Attesting Officer*   *Commissioner of Patents and Trademarks*